(12) United States Patent
Gao (10) Patent No.: US 11,968,803 B2
(45) Date of Patent: Apr. 23, 2024

(54) TWO PHASE IMMERSION SYSTEM WITH LOCAL FLUID ACCELERATIONS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 182 days.

(21) Appl. No.: 17/559,741

(22) Filed: Dec. 22, 2021

(65) Prior Publication Data
US 2023/0200009 A1 Jun. 22, 2023

(51) Int. Cl.
H05K 7/20 (2006.01)

(52) U.S. Cl.
CPC ......... *H05K 7/203* (2013.01); *H05K 7/20327* (2013.01); *H05K 7/20509* (2013.01)

(58) Field of Classification Search
CPC . H05K 7/203; H05K 7/20327; H05K 7/20509
USPC ........................................................ 361/434
See application file for complete search history.

(56) References Cited

U.S. PATENT DOCUMENTS

| | | | |
|---|---|---|---|
| 3,024,298 A * | 3/1962 | Goltsos | F25B 23/006 165/47 |
| 4,949,164 A * | 8/1990 | Ohashi | H01L 23/427 165/80.4 |
| 6,253,835 B1 * | 7/2001 | Chu | F28F 3/12 174/15.1 |
| 6,550,263 B2 * | 4/2003 | Patel | H01L 23/4735 165/80.4 |
| 6,679,315 B2 * | 1/2004 | Cosley | H05K 1/0203 257/E23.098 |
| 6,807,056 B2 * | 10/2004 | Kondo | H05K 7/20781 361/689 |
| 6,942,018 B2 * | 9/2005 | Goodson | F28D 15/00 174/15.1 |
| 6,986,382 B2 * | 1/2006 | Upadhya | H01L 23/473 174/15.1 |
| 6,994,151 B2 * | 2/2006 | Zhou | H01L 23/427 174/15.1 |
| 7,000,684 B2 * | 2/2006 | Kenny | F04B 19/006 174/15.1 |
| 7,017,654 B2 * | 3/2006 | Kenny | H01L 21/4871 174/15.1 |
| 7,134,486 B2 * | 11/2006 | Santiago | B01D 67/0062 257/E23.098 |

(Continued)

*Primary Examiner* — Anatoly Vortman
(74) *Attorney, Agent, or Firm* — WOMBLE BOND DICKINSON (US) LLP (57) ABSTRACT

A cooling plate includes an inlet port to receive two-phase fluid, a base plate to be attached to server electronics for cooling, a number of heat spreading structures disposed and spaced apart on the base plate to extend a heat exchange area from the base plate, and a number of fluid channels disposed on the base plate, where each of the fluid channels is situated between a pair of adjacent heat spreading structures. Each of the fluid channels include a channel inlet to receive at least a portion of the two-phase fluid from the inlet port, a channel outlet to allow the received portion of the two-phase fluid to flow through and exit the corresponding fluid channel, and one or more intermediate outlets disposed between the channel inlet and the channel outlet to allow at least a portion of the received two-phase fluid to exit in vapor or liquid form.

20 Claims, 8 Drawing Sheets

(56) References Cited

U.S. PATENT DOCUMENTS

| | | | | |
|---|---|---|---|---|
| 7,188,662 B2 * | 3/2007 | Brewer | H01L 23/473 | 257/E23.098 |
| 7,212,405 B2 * | 5/2007 | Prasher | H01L 23/473 | 257/E23.098 |
| 7,764,494 B2 * | 7/2010 | Balzano | H01L 23/473 | 361/689 |
| 7,849,914 B2 * | 12/2010 | Di Stefano | H01L 23/473 | 165/80.4 |
| 10,416,736 B2 * | 9/2019 | Dupont | H05K 7/20936 | |
| 10,674,641 B2 * | 6/2020 | Shepard | H05K 7/203 | |
| 10,840,167 B2 * | 11/2020 | McNamara | H01L 23/367 | |
| 10,999,951 B2 * | 5/2021 | Tsunoda | H05K 7/20772 | |
| 11,357,130 B2 * | 6/2022 | Manousakis | G06F 1/20 | |
| 11,683,910 B2 * | 6/2023 | Chen | H05K 7/20272 | 361/679.46 |
| 2002/0007935 A1 * | 1/2002 | Marsala | F25B 39/022 | 257/E23.098 |
| 2004/0188064 A1 * | 9/2004 | Upadhya | F04B 17/00 | 257/E23.098 |
| 2005/0117301 A1 * | 6/2005 | Prasher | H01L 23/4006 | 361/699 |
| 2005/0200001 A1 * | 9/2005 | Joshi | F28F 3/08 | 257/714 |
| 2005/0285261 A1 * | 12/2005 | Prasher | H01L 23/427 | 257/E23.098 |
| 2006/0050483 A1 * | 3/2006 | Wilson | H01L 23/473 | 361/689 |
| 2006/0196646 A1 * | 9/2006 | Myers | H01L 23/473 | 257/E23.098 |
| 2010/0328889 A1 * | 12/2010 | Campbell | H05K 7/20809 | 361/699 |
| 2014/0071626 A1 * | 3/2014 | Campbell | B23P 15/26 | 165/165 |
| 2022/0408587 A1 * | 12/2022 | Kelley | H05K 7/20327 | |
| 2023/0114730 A1 * | 4/2023 | Sprenger | G06F 1/20 | 165/11.1 |
| 2023/0200005 A1 * | 6/2023 | Gao | H05K 7/20809 | 361/679.53 |

\* cited by examiner

TWO PHASE IMMERSION SYSTEM WITH LOCAL FLUID ACCELERATIONS

FIELD OF THE INVENTION

Embodiments of the present invention relate generally to server and data center cooling. More particularly, embodiments of the invention relate to two phase immersion system with local fluid accelerations.

BACKGROUND

Thermal management for a data center that includes several active electronic racks is critical to ensure proper performance of servers and/or other IT equipment (e.g., performing IT services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use of cooling air to cool the IT equipment. The cooling air is recirculated through cooling units. Heat generated by the IT equipment is captured by the cooling air and is extracted by the cooling unit.

Recently, data centers have been deploying high-power density electronic racks, where a large quantity of high-density chips are packaged closer together to provide more computing power. Cooling these high-density racks by maintaining a proper thermal environment may be an issue with existing cooling systems, such as a computer room air conditioning (CRAC) unit. For instance, although the CRAC unit may maintain the thermal environment with more conventional (or lower-density) racks, the unit may be unable to effectively cool high-power density racks because they may generate heat load at a higher rate due to the higher density electronics. Or significant cost may be needed for upgrading a CRAC system to satisfy a cooling requirement of a high density deployment. Another challenge for air cooling high density racks is moving a large amount of airflow sufficient to cool the racks. Since heat removal capacity of fluid is much larger than heat removal capacity of air, thus it is more economical to move cooling fluid for cooling. Therefore, designing the cooling fluid closer to the IT, indirectly or directly in contact with electronics are an effective mean.

Immersion cooling, which involves at least partially submerging electronics in a non-conductive dielectric solution, is a feasible solution for high-density electronics. Existing two phase immersion cooling only considers fluid recirculation for an electronic rack without local cooling acceleration. Heterogeneous electronic components can give rise to predictable hot spots with two-phase immersion cooling. Therefore, there is a need for local cooling acceleration to accommodate hot spots for different electronic hardware, chips, and configurations.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Existing solutions for two phase immersion system only considers rack level fluid recirculation without any local cooling acceleration. Embodiments of this disclosure presents hardware designs for cooling devices used in both server and immersion tanks for a better management and recirculation of two phase immersion cooling fluids. The current hardware designs can be used for heterogeneous servers for different chip configurations to coexist in a single tank.

According to a first aspect, a cooling plate includes an inlet port to receive two-phase fluid, a base plate to be attached to server electronics for cooling, a number of heat spreading structures disposed and spaced apart on the base plate to extend a heat exchange area from the base plate, and a number of fluid channels disposed on the base plate, where each of the fluid channels is situated between a pair of adjacent heat spreading structures. Each of the fluid channels include a channel inlet to receive at least a portion of the two-phase fluid from the inlet port, a channel outlet to allow the received portion of the two-phase fluid to flow through and exit the corresponding fluid channel, and one or more intermediate outlets disposed between the channel inlet and the channel outlet to allow at least a portion of the received two-phase fluid to exit in vapor or liquid form. Note that two-phase fluid refers to a liquid coolant where cooling is provided to electronics by undergoing a phase change from liquid phase to vapor phase when the electronics is in thermal contact with the liquid coolant during cooling.

In one embodiment, the heat spreading structures are in thermal contact with the fluid channels. In one embodiment, the cooling plate further includes an inlet channel coupled between the inlet port and the channel inlet of each of the fluid channels to distribute the two-phase fluid to the fluid channels. In one embodiment, each of the heat spreading structures has a height greater than a height of a corresponding fluid channel. In one embodiment, the form factors of each of the fluid channels are different. In one embodiment, an intermediate outlet of a corresponding fluid channel is in a serpentine shape or a rectangle shape.

In one embodiment, each of the fluid channels includes at least one outlet near a tip portion of a corresponding heat spreading structure. In one embodiment, the intermediate outlets are disposed on a surface of the corresponding fluid channel that is away from the base plate. In one embodiment, the channel inlet is disposed at a first end of the corresponding fluid channel and the channel outlet is disposed on a second end of the corresponding fluid channel. In one embodiment, the two-phase fluid either in vapor phase or mixed phase is to exit a fluid channel to merge with the two-phase immersion fluid in an immersion tank environment, when the cooling plate is submerged into the two-phase immersion fluid.

According to a second aspect, a server enclosure includes one or more supply lines, one or more fluid supply connectors coupled to the one or more supply lines, a server chassis to contain server electronics therein, where the server chassis is to be at least partially submerged in a two phase immersion fluid, and one or more cooling plates contained within the server chassis. A cooling plate includes an inlet port to receive two-phase fluid from a fluid supply connector, a base plate to be attached to server electronics for cooling, a number of heat spreading structures disposed and spaced apart on the base plate to extend a heat exchange area from the base plate, and a number of fluid channels disposed on the base plate, where each of the fluid channels is situated between a pair of adjacent heat spreading structures. Each of the fluid channels include a channel inlet to receive at least a portion of the two-phase fluid from the inlet port, a channel outlet to allow the received portion of the two-phase fluid to flow through and exit the corresponding fluid channel, and one or more intermediate outlets disposed between the channel inlet and the channel outlet to allow at least a portion of the received two-phase fluid to exit in vapor or liquid form.

According to a third aspect, a cooling system includes an immersion enclosure, and a distribution manifold coupled to the immersion enclosure, the distribution manifold includes one or more fluid outlets and a pump to distribute a two-phase fluid containable in the immersion enclosure to the one or more fluid outlets. The cooling system includes a server enclosure containable within the immersion enclosure. The server enclosure includes one or more supply lines, one or more fluid supply connectors coupled between the one or more fluid outlets of the distribution manifold and the one or more supply lines, a server chassis to contain server electronics therein, where the server chassis is to be at least partially submerged in a two phase immersion fluid, and one or more cooling plates contained within the server chassis.

A cooling plate includes an inlet port to receive two-phase fluid from a fluid supply connector, a base plate to be attached to server electronics for cooling, a number of heat spreading structures disposed and spaced apart on the base plate to extend a heat exchange area from the base plate, and a number of fluid channels disposed on the base plate, where each of the fluid channels is situated between a pair of adjacent heat spreading structures. Each of the fluid channels include a channel inlet to receive at least a portion of the two-phase fluid from the inlet port, a channel outlet to allow the received portion of the two-phase fluid to flow through and exit the corresponding fluid channel, and one or more intermediate outlets disposed between the channel inlet and the channel outlet to allow at least a portion of the received two-phase fluid to exit in vapor or liquid form. The fluid outlets on the distribution manifold can be quick disconnects designed to be engaged with the server fluid supply connectors.

In one embodiment, the cooling system includes a temperature sensor, where the pump is controllable by the temperature sensor to manage a flow of the two-phase fluid to the fluid channels. In another embodiment, the temperature sensor can be part of the server electronics.

Figure 1:
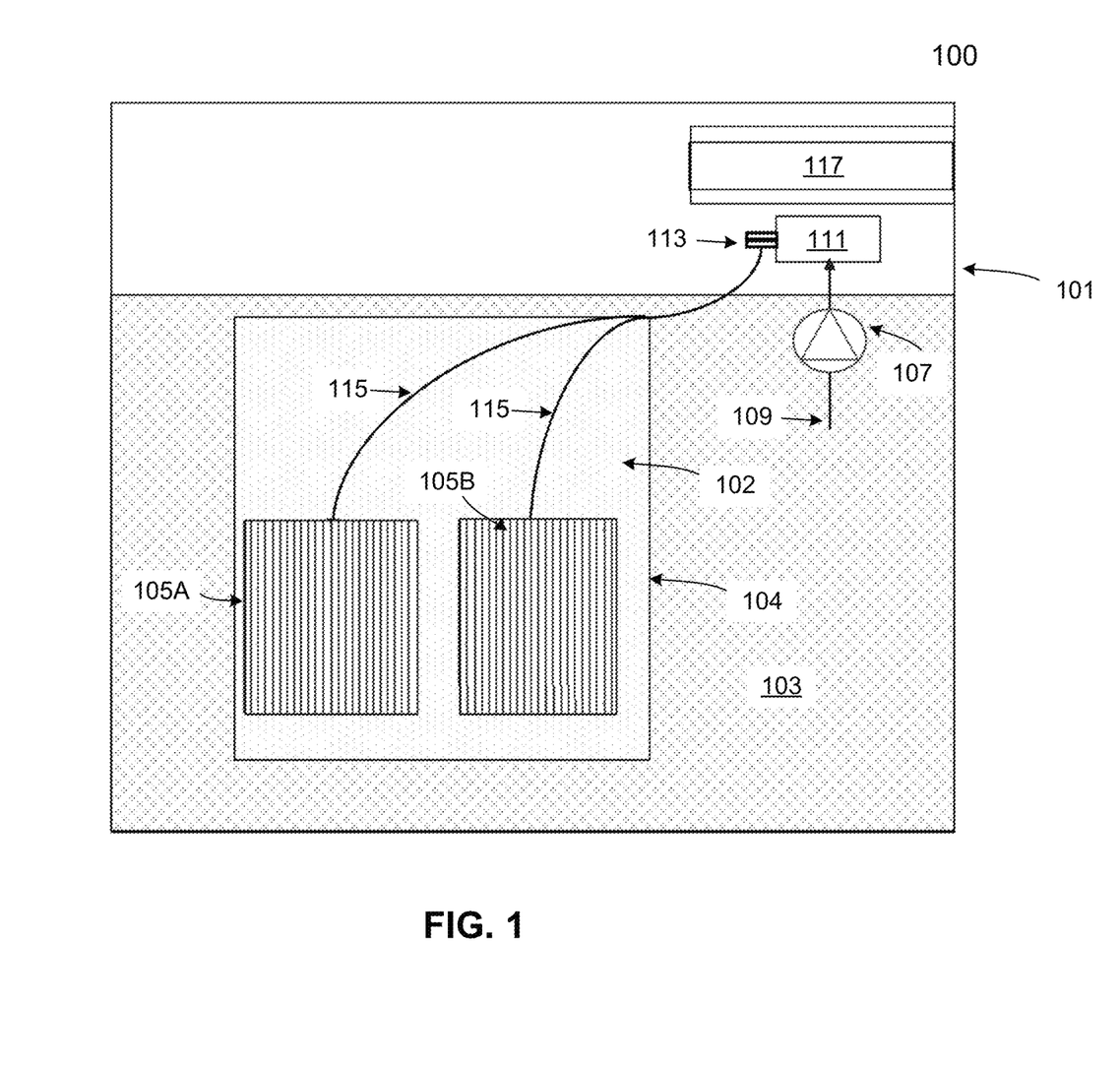
FIG. 1 is a block diagram illustrating a two-phase immersion cooling system according to one embodiment.

FIG. 1 is a block diagram illustrating a two-phase immersion cooling system 100 according to one embodiment. Cooling system 100 can include a server enclosure 104 which can include electronic servers (or servers 102) submerged in two-phase immersion coolant fluid 103 contained within an immersion enclosure 101 for immersion cooling.

Servers 102 can be configured to provide IT services. Specifically, servers 102 may include a host server (referred to as a host node) and/or one or more compute servers (also referred to as computing nodes, such as CPU server and GPU server). The host server (having one or more CPUs) typically interfaces with clients (not shown) over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. In one embodiment, servers 102 can perform any type of computing task and/or can be any type of computing device (e.g., a server, a storage device, etc.). In one embodiment, servers 102 can be edge computing devices. Thus, while servers 102 provide the IT services, each of servers 102 generates heat that is transferred to two-phase immersion fluid 103.

In one embodiment, cooling system 100 includes a pump 107 and a loop line 109 which are packaged within immersion enclosure 101. In one embodiment, pump 107 is part of a distribution manifold 111 and pump 107 is submerged in two-phase immersion fluid 103. In another embodiment, pump 107 is above or partially above two-phase immersion fluid 103 and loop line 109 extends to two-phase immersion fluid 103.

In one embodiment, system 100 includes distribution manifold 111. Distribution manifold 111 can be connected to pump 107 and distribution manifold 111 can be located above two-phase fluid 103. Distribution manifold 111 can include fluid outlets 113 to distribute fluid to supply lines 115 which supplies fluid to individual cooling modules 105A-B.

Each of servers 102 can include server electronics that can be attached to one or more cooling plates 105A-B for cooling acceleration. When deployed, cooling plates 105A-B are supplied two-phase fluid from distribution manifold 111 through fluid outlets 113 and supply lines 115.

In one embodiment, system 100 includes a condensing unit (condenser) 117 located at an upper portion within immersion enclosure 101 and is used for condensing two-phase coolant in vapor phase, back to liquid phase. Note that cooling plates 105A-B can be coupled to a distribution manifold to supply two-phase fluid to cooling plates 105A-B to extract heat from server electronics attachable to cooling plates 105A-B. Two-phase fluid in liquid phase can exit from cooling plates 105A-B and merge with two-phase immersion fluid 103. Two-phase fluid in vapor phase can exit from cooling plates 105A-B to rise up to an upper portion of immersion enclosure 101. The vapor can then enter condensing unit 117, which causes the vapor to condense back to liquid phase. The two-phase fluid in liquid phase is to directly drip back to immersion enclosure 101 via gravity and merge with two-phase immersion fluid 103 in immersion enclosure 101.

Figure 2A:
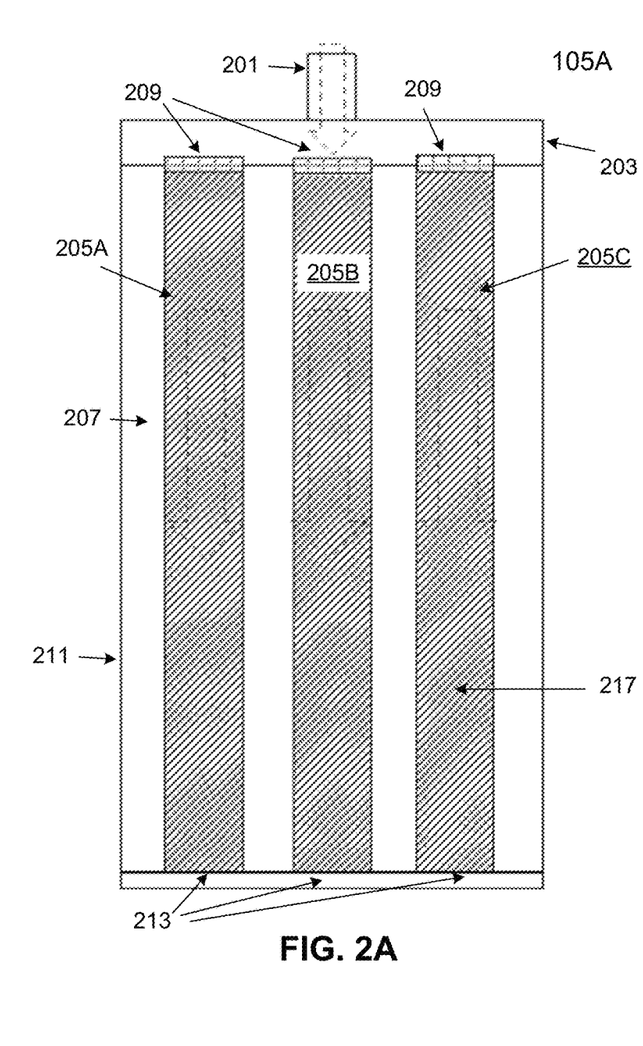
FIGS. 2A-2B are block diagrams illustrating a top view of a cooling plate according to some embodiments.

FIG. 2A is a block diagram illustrating a top view of a cooling plate 105A according to one embodiment. Cooling plate 105A can include an inlet port 201 and an inlet channel 203 coupled to inlet port 201. Inlet port 201 can be used to receive a supply of two phase coolant fluid in liquid phase. The supply of two-phase coolant fluid can enter inlet channel 203. Inlet channel 203 can fan out the two-phase coolant fluid to distribute the two-phase coolant fluid to channel inlets 209 corresponding to each of one or more fluid channels 205A-C of cooling plate 105A. The one or more fluid channels 205A-C can be disposed on a base plate 211 of cooling plate 105A. In one embodiment, fluid channels 205A-C can be made of porous mesh materials that surround and shape the channels. In one embodiment, fluid channels 205A-C are channels with open spacing on the top and bottom.

Channel inlets 209 corresponding to fluid channels 205A-C can be secured to inlet channel 203 to receive two-phase fluid from inlet channel 203. Channel inlets 209 is the entry point of two-phase fluid for the fluid channels 205A-C.

In one embodiment, cooling plate 105A includes base plate 211 and one or more heat spreading structures 207 to extend a heat exchange area from base plate 211. Heat spreading structures 207 can be disposed and spaced apart on base plate 211 of cooling plate 105A. Heat spreading structures 207 and/or base plate 211 can be copper, aluminum, any other heat conducting materials, or a combination thereof. In one embodiment, heat spreading structures 207 can be in thermal contact with adjacent fluid channels 205A-C. Fluid channels 205A-C are designed to channel two phase fluid through a length of fluid channels, where two-phase fluid can exit at one or more intermediate outlets along fluid channels or at an outlet situated at an opposite end of the fluid channels. Two-phase fluid can extract heat away from base plate 211 or heat spreading structures 207 by virtue of the fluid channels 205A-C being in thermal contact with base plate 211 and/or heat spreading structures 207, where base plate 211 is attachable to server electronics to accelerate cooling for the server electronics. In one embodiment, fluid channels 205A-C are inserted under and secured by bridges 217. Cooling plate 105A can also include outlet port 213 at end of fluid channels 205A-C where two phase fluid can exit from cooling plate 105A. Two-phase fluid that exits cooling plate 105A in liquid phase can merge with two-phase immersion fluid in immersion enclosure 101, whereas, two-phase fluid that exists cooling plate 105A in vapor phase can rise to an upper portion of immersion enclosure 101. The vapor can be condensed by condensing unit 117 and the condensed fluid can fall directly in immersion enclosure 101. Thus, cooling plate 105A with the heat spreading structures 207 and fluid channels 205A-C can accelerate cooling for server electronics of server 202.

Figure 2B:
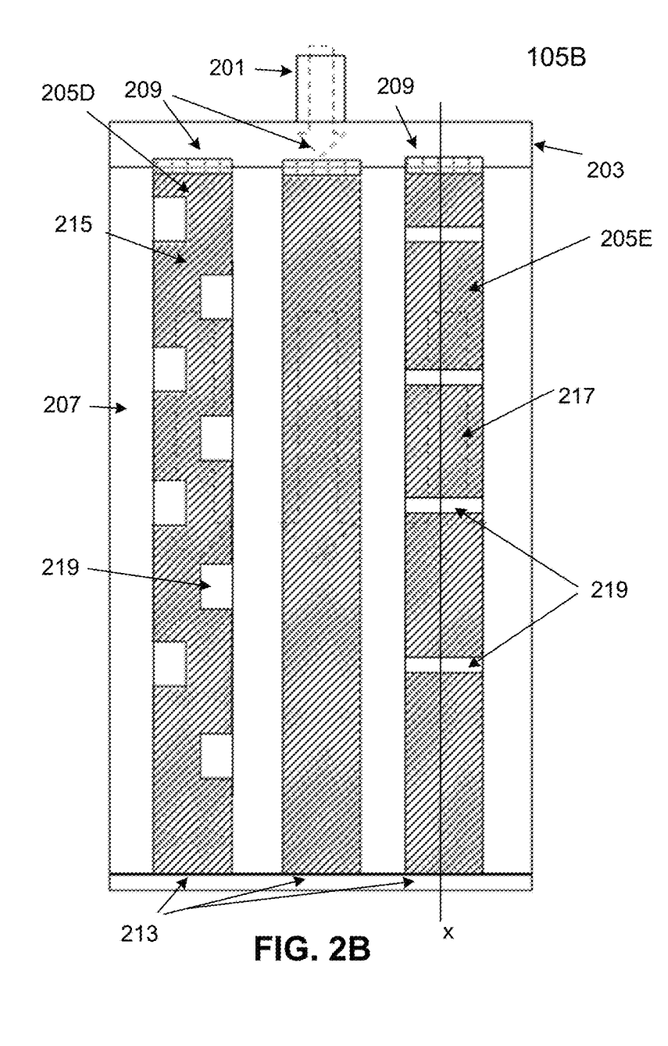
Figure 3A:
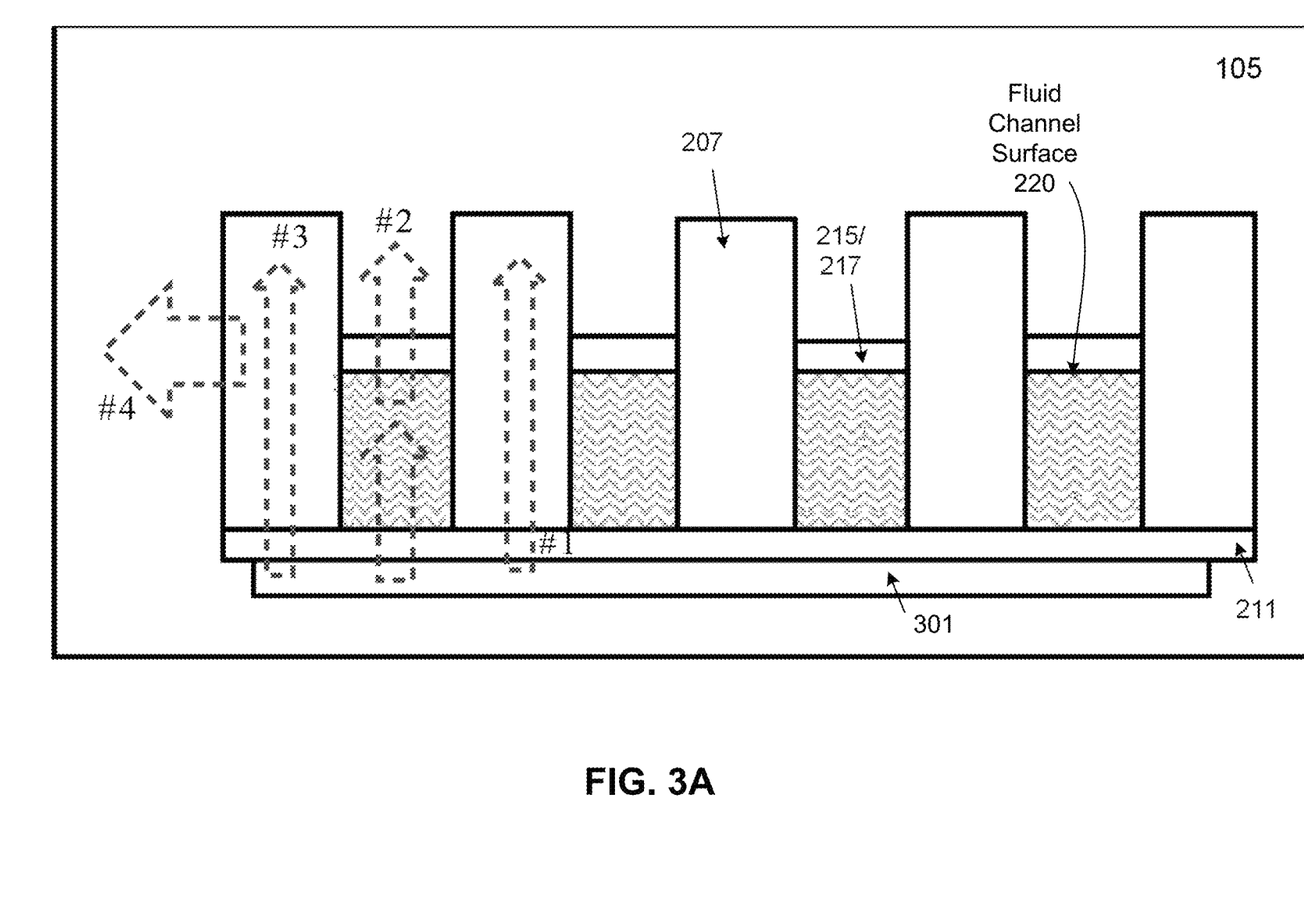
FIG. 3A is a block diagram illustrating a side view of a cooling plate according to one embodiment.

FIG. 2B is a block diagram illustrating a top view of a cooling plate 105B according to one embodiment. Cooling plate 105B can include heat spreading structures 207 and fluid channels 205D-E. In one embodiment, as shown in FIG. 2B, portions of heat spreading structures 207 can include serpentine or teeth-shaped edges 215 or bridges 217, or any other shapes, to secure fluid channels 205D-E. As shown in FIG. 3A, edges 215 or bridges 217 can be disposed between heat spreading structures 207 to form intermediate outlets 219 on a surface 220 of the fluid channel that is away from base plate 211. Edges 215/bridges 217 can be position at approximately half the height of heat spreading structures 207. Note that a fluid channel 205 can be situated between two adjacent structures 207 and below edges 215 or bridges 217 as shown in FIG. 3A. Referring back to FIGS. 2A-B, channels 205A-E can include intermediate outlets 219 for two-phase fluid to exit cooling plate 105.

In one embodiment, as previously described, heat spreading structures 207 and base plate 211 can be machined as a single component, since teeth 215 or bridges 217 are at approximate half the height of heat spreading structures 207, fluid channels 205 can be inserted into the spaces between heat spreading structures 207, base plate 211, and teeth 215/bridge 217. That is, fluid channels 205 can be beneath teeth 215/bridge 217 and teeth 215/bridge 217 can provide structural support for, and secure, fluid channels 205.

FIG. 3A is a block diagram illustrating a side view of a cooling plate 105 according to one embodiment. As shown in FIG. 3A, in one embodiment, a height of heat spreading structures 207 of cooling plate 105 is greater than a height of fluid channels 205. In one embodiment, fluid channels 205 are secured by bridges 217 or serpentine/teeth edges 215. In one embodiment, heat spreading structures 207 and/or bridges 217 or teeth 215 can be assembled or directly machined on base plate 211. Base plate 211 can be directly attached onto high performance server electronics 301, as part of server 102 of FIG. 1. As previously described, an end of fluid channels 205 opposite from base plate 211 can function as outlets for two-phase coolant fluid. Thus, the fluid, either in vapor phase or mixed phase, can exit from fluid channel 205 to merge in an immersion tank environment.

The heat flow (or thermal cooling) of cooling plate 105 can be shown by #1-5. Here, #1 can represent an overall heat flow from server electronics 301 to cooling plate 105; #2 represents active heat extraction at fluid channels 205 via two phase fluid; #3 represents heat conduction by heat spreading structures 207; and #4 shows heat extraction from heat spreading structures 207 to two phase immersion fluid in surrounding immersion environment.

Figure 3B:
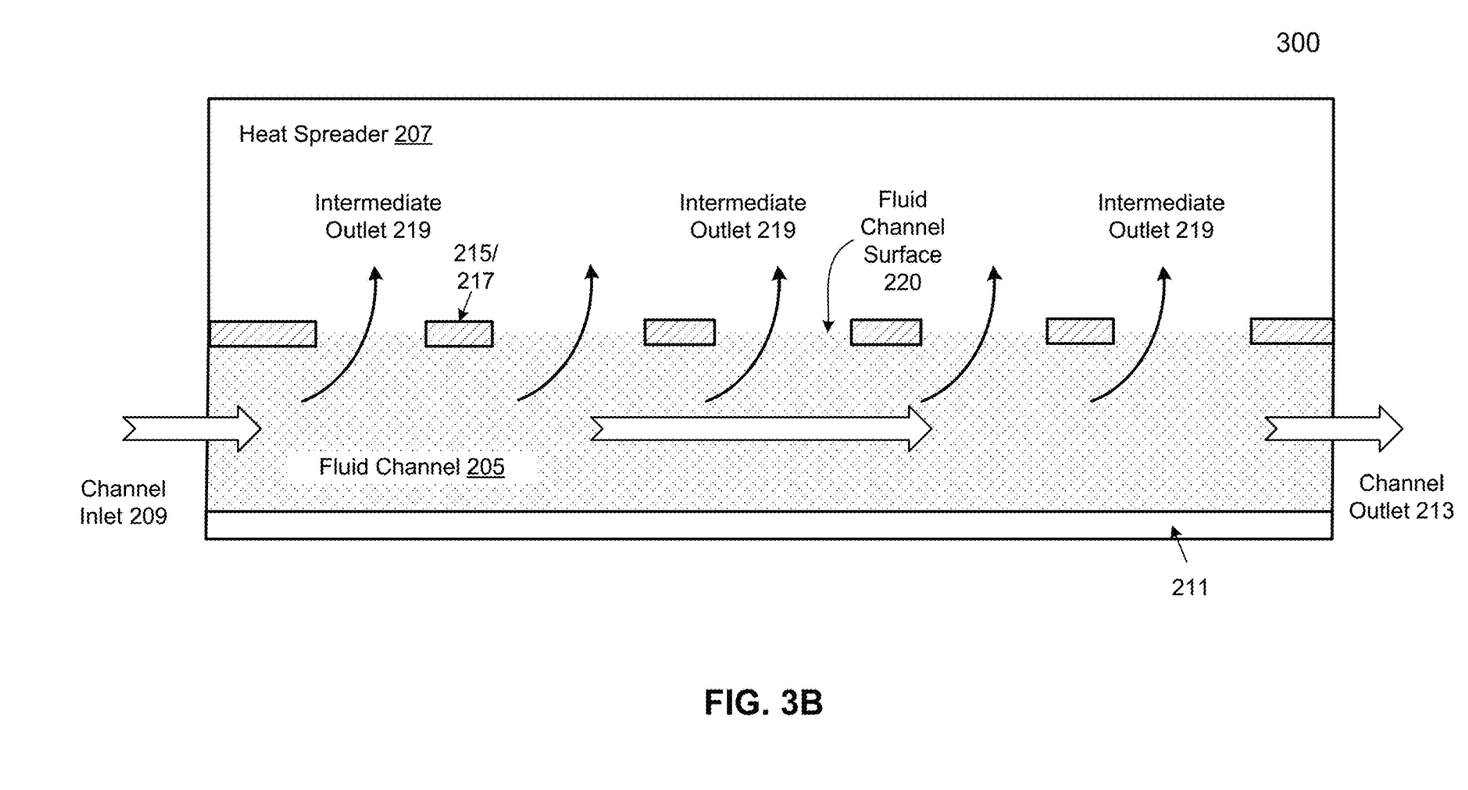
FIG. 3B is a block diagram illustrating a cross section view of a fluid channel according to one embodiment.

FIG. 3B is a block diagram 300 illustrating a cross section view of a fluid channel 205 according to one embodiment. Block diagram 300 can represent a view at cross section x of FIG. 2B. As shown in FIG. 3B, a fluid channel 205 provides a channel for two-phase fluid to flow from channel inlet 209 to channel outlet 213. Two-phase fluid can exit at channel outlet 213 or to any of intermediate channel outlets 219 in liquid phase or mix phase. In this embodiment, a fluid channel 205 is formed by base plate 211 and exterior surfaces of adjacent heat spreaders 207. On top of fluid channel 205 are intermediate outlet(s) 219 formed by 215/217 between two adjacent heat spreaders 207.

Figure 4:
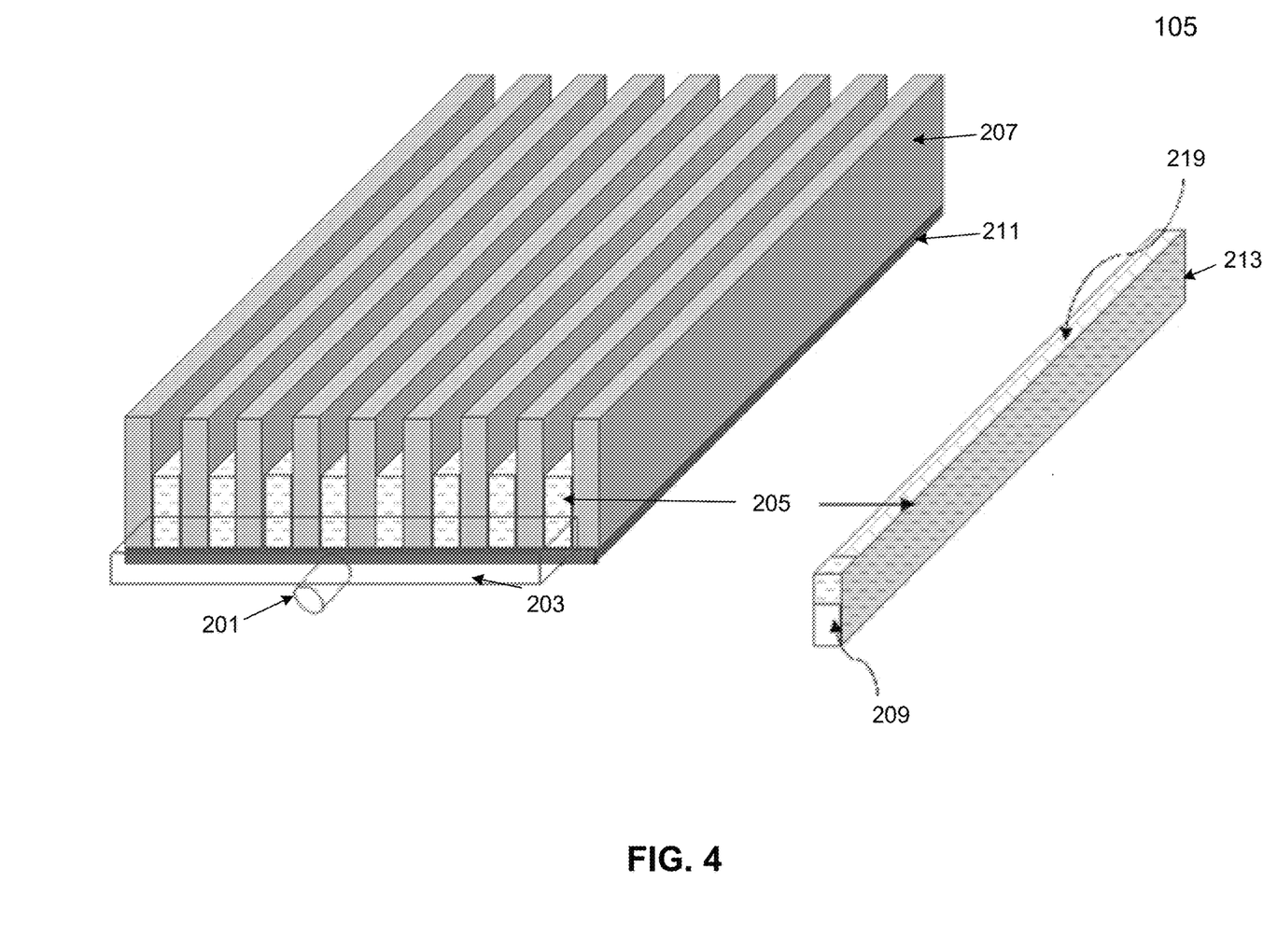
FIG. 4 is a block diagram illustrating a perspective view of a cooling plate according to one embodiment.
Figure 5:
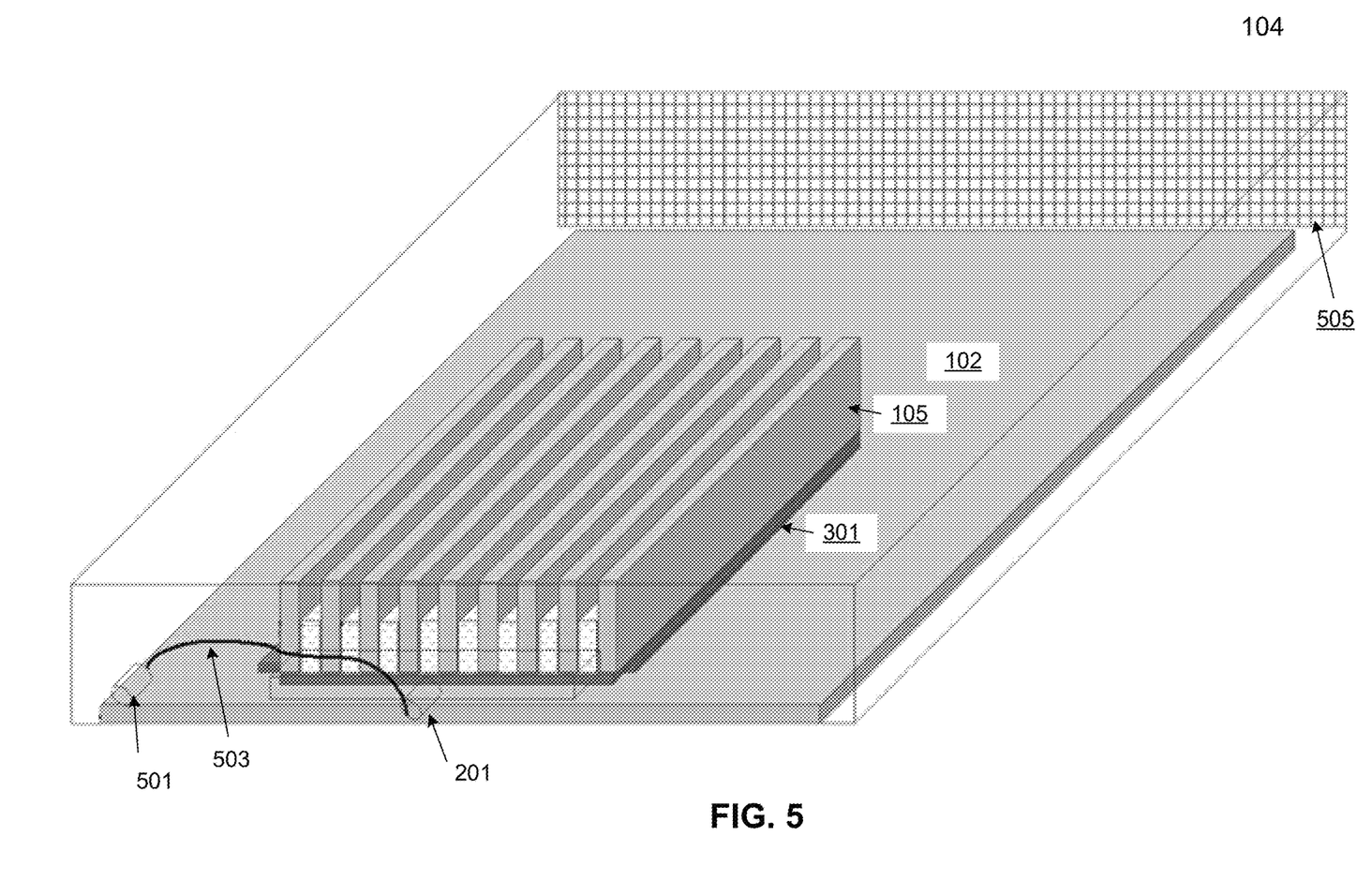
FIG. 5 is a block diagram illustrating a perspective view of a server enclosure according to one embodiment.

FIG. 4 is a block diagram illustrating a perspective view of a cooling plate 105 according to one embodiment. FIG. 5 is a block diagram illustrating a perspective view of a server enclosure according to one embodiment. The inlet channel 203 can include openings or intermediate outlets to engage with channel inlets 209.

As shown in FIGS. 4-5, a cooling plate 105 can include inlet port 201, inlet channel 203, fluid channels 205, and heat spreading structures 207. Fluid channels 205 can include outlet ports 213. Further, a fluid channel 205 can include an inlet 209 engaged with the inlet channel 203. Anywhere along the fluid channel can be additional intermediate outlets 219 for two-phase fluid to exit from cooling plate 105.

As show in FIG. 5, server enclosure 104 can be used to house cooling plate 105 and server electronics 301. Server enclosure 104 can include a housing inlet port 501 and an integrated loop 503 to direct fluid flow from inlet port 501 to port 201 of cooling plate 105. Inlet port 501 can be connected to a distribution manifold 111 (shown in FIG. 1). In one embodiment, cooling plate 105 can be equipped with extensible inlet port 201 (which can directly connect to a distribution manifold 1111). In one embodiment, server enclosure 104 can include a chassis main frame that includes openings/perforations 505 for fluid recirculation. Note that during operation, server enclosure 104, server electronics 301, and/or server 102 can be fully or partially submerged in two phase fluid in an immersion environment.

Figure 6:
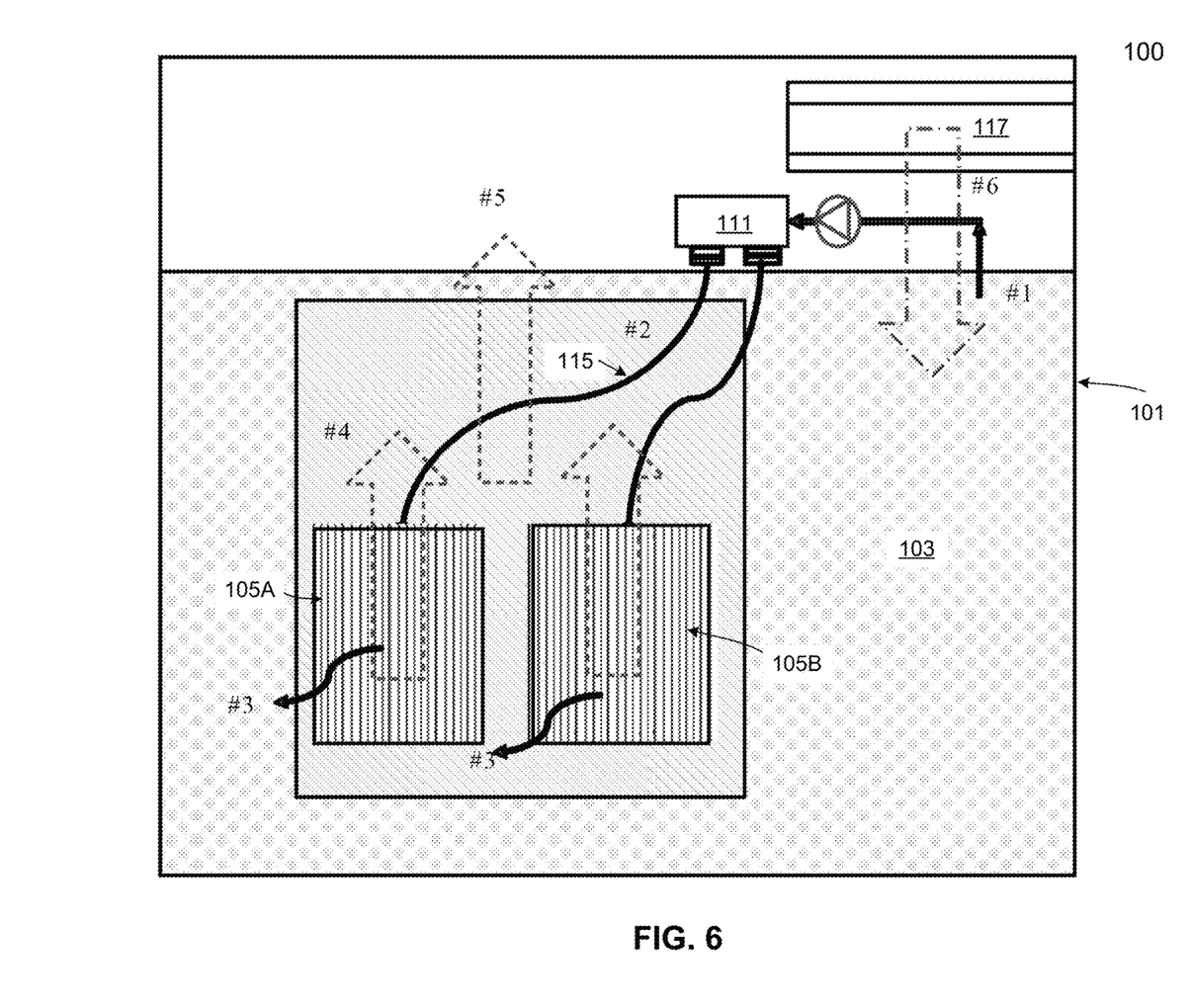
FIG. 6 is a block diagram illustrating system operations of a two-phase immersion cooling system according to one embodiment.

FIG. 6 is a block diagram illustrating system operations of a two-phase immersion cooling system 100 according to one embodiment. Referring to FIG. 6, during an operational state, the system operations of cooling system 100 can be described by #1-#6. As shown, #1 can represent two-phase immersion fluid 103, that is in liquid phase in an immersion enclosure 101, being pumped to distribution manifold 111. #2 can represent a supply of two-phase fluid being supplied to cooling plates 105A-B, via supply manifold 111 via lines 115. #3 can represent two-phase fluid exiting from cooling plates 105A-B, in liquid phase. #4 can represent two-phase fluid exiting from cooling plates 105A-B in vapor phase, where the two-phase fluid is caused to evaporate by either or both of heat spreading structures and/or fluid channels. #5 can represent an overall vapor path for two-phase coolant in vapor phase. Here, vapor rises above two-phase immersion fluid 103 in liquid phase. #6 can represent the vapor being condensed back to two-phase fluid 103 in liquid phase by condensing unit 117, where two-phase fluid merge with two-phase immersion fluid 103.

Figure 7:
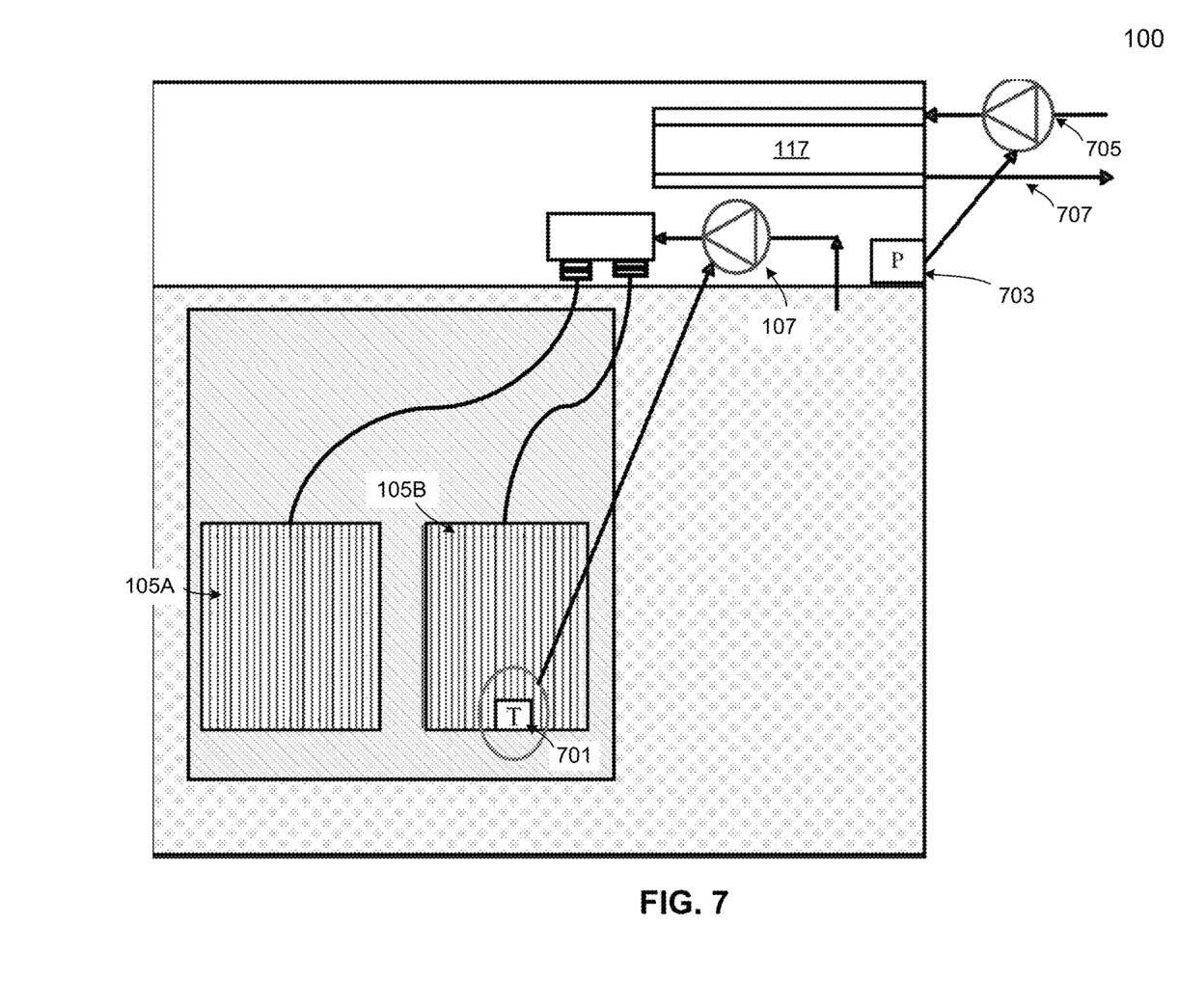
FIG. 7 is a block diagram illustrating system controls of a two-phase immersion cooling system according to one embodiment.

FIG. 7 is a block diagram illustrating system controls of a two-phase immersion cooling system 100 according to one embodiment. As shown in FIG. 7, in one embodiment, immersion cooling system 100 includes a pump 705 and lines 707 to supply an external cooling fluid (air, antifreeze, water, etc.) to condensing unit 117. The system control design can be implemented for pumps 107 and 705 as follows:

In one embodiment, immersion cooling system 100 includes one or more temperature sensors 701 that can be used to manage a rate of fluid flow through pump 107. For example, a highest sensor reading and/or an average reading of sensors 701 above a threshold can trigger a rate increase for pump 107. Temperature sensors 701 can be part of server electronics that can obtain temperature readings of the server electronics (high density chips), or can be implemented near cooling plate 105 or as part of cooling plate 105. For example, temperature sensors 701 can be embedded at a heat spreading structure, a fluid channel, or a base plate of cooling plate 105.

In one embodiment, immersion system 100 includes a power sensor 703 to sense power used by immersion enclosure 101. For example, a reading of sensor 703 above a threshold can trigger an increase in flow rate for pump 705, thus, increases an external cooling capacity delivered by external loop 707 to condensing unit 117. Thus, the cooling plate and the immersion cooling system can maintain a two-phase immersion environment and also utilizes two-phase fluid for local cooling accelerations.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling plate, comprising:
   an inlet port to receive a two-phase fluid from a cooling source;
   a base plate configured to be attached to server electronics for cooling;
   a plurality of heat spreading structures disposed and spaced apart on the base plate to extend a heat exchange area from the base plate; and
   a plurality of fluid channels disposed on the base plate, wherein each of the plurality of fluid channels is inserted and secured between a pair of adjacent heat spreading structures, wherein each of the fluid channels comprises:
      a channel inlet to receive at least a portion of the two-phase fluid from the inlet port,
      a channel outlet to allow the received portion of the two-phase fluid to flow through and exit the corresponding fluid channel, and
      one or more intermediate outlets disposed between the channel inlet and the channel outlet to allow at least a portion of the received two-phase fluid to exit the cooling plate either in a vapor form or a liquid form.

2. The cooling plate of claim 1, wherein the plurality of heat spreading structures are in thermal contact with the plurality of fluid channels.

3. The cooling plate of claim 1, further comprising an inlet channel coupled between the inlet port and the channel inlet of each of the fluid channels to distribute the two-phase fluid to the fluid channels.

4. The cooling plate of claim 1, wherein each of the plurality of heat spreading structures has a height greater than a height of a corresponding fluid channel.

5. The cooling plate of claim 1, wherein at least one of the one or more intermediate outlets of a corresponding fluid channel is in a serpentine shape or a rectangle shape.

6. The cooling plate of claim 1, wherein each of the plurality of fluid channels comprises at least one outlet near a tip portion of the corresponding heat spreading structure.

7. The cooling plate of claim 1, wherein the intermediate outlets are disposed on a surface of the corresponding fluid channel that is away from the base plate.

8. The cooling plate of claim 1, wherein the channel inlet is disposed at a first end of the corresponding fluid channel and the channel outlet is disposed on a second end of the corresponding fluid channel.

9. The cooling plate of claim 1, wherein the two-phase fluid either in vapor phase or mixed phase is to exit the fluid channel to merge with the two-phase fluid in an immersion tank environment, when the cooling plate is submerged into the two-phase fluid.

10. A server enclosure, comprising:
    one or more supply lines;
    one or more fluid supply connectors coupled to the one or more supply lines;
    a server chassis configured to contain server electronics therein, wherein the server chassis is configured to be at least partially submerged in a two phase immersion fluid; and one or more cooling plates contained within the server chassis, wherein each cooling plate comprises:
an inlet port to receive two-phase fluid from a fluid supply connector;
a base plate configured to be attached to the server electronics for cooling;
a plurality of heat spreading structures disposed and spaced apart on the base plate to extend a heat exchange area from the base plate; and
a plurality of fluid channels disposed on the base plate, wherein each of the plurality of fluid channels is inserted and secured between a pair of adjacent heat spreading structures, wherein each of the fluid channels comprises:
a channel inlet to receive at least a portion of the two-phase fluid from the inlet port,
a channel outlet to allow the received portion of the two-phase fluid to flow through and exit the corresponding fluid channel, and
one or more intermediate outlets disposed between the channel inlet and the channel outlet to allow at least a portion of the received two-phase fluid to exit the cooling plate either in a vapor form or a liquid form.

11. The server enclosure of claim 10, wherein the plurality of heat spreading structures are in thermal contact with the plurality of fluid channels.

12. The server enclosure of claim 10, further comprising an inlet channel coupled between the inlet port and the channel inlet of each of the fluid channels to distribute the two-phase fluid to the fluid channels.

13. The server enclosure of claim 10, wherein each of the plurality of heat spreading structures has a height greater than a height of a corresponding fluid channel.

14. The server enclosure of claim 10, wherein at least one of the one or more intermediate outlets of a corresponding fluid channel is in a serpentine shape or a rectangle shape.

15. The server enclosure of claim 10, wherein each of the plurality of fluid channels comprises at least one outlet near a tip portion of the corresponding heat spreading structure.

16. The server enclosure of claim 10, wherein the intermediate outlets are disposed on a surface of the corresponding fluid channel that is away from the base plate.

17. The server enclosure of claim 10, wherein the channel inlet is disposed at a first end of the corresponding fluid channel and the channel outlet is disposed on a second end of the corresponding fluid channel.

18. The server enclosure of claim 10, wherein the two-phase fluid either in vapor phase or mixed phase is to exit the fluid channel to merge with the two-phase immersion fluid in an immersion tank environment, when the cooling plate is submerged into the two-phase immersion fluid.

19. A cooling system, comprising:
an immersion enclosure;
a distribution manifold coupled to the immersion enclosure, wherein the distribution manifold comprises:
one or more fluid outlets; and
a pump to distribute a two-phase fluid from the immersion enclosure to the one or more fluid outlets; and
a server enclosure within the immersion enclosure, wherein the server enclosure comprises:
one or more supply lines;
one or more fluid supply connectors coupled between the one or more fluid outlets of the distribution manifold and the one or more supply lines;
a server chassis configured to contain server electronics therein, wherein the server chassis is configured to be at least partially submerged in a two-phase immersion fluid; and
one or more cooling plates configured to be attached to the server electronics, wherein a cooling plate comprises:
an inlet port to receive the two-phase fluid from a fluid supply connector;
a base plate configured to be attached to the server electronics for cooling;
a plurality of heat spreading structures disposed and spaced apart on the base plate to extend a heat exchange area from the base plate; and
a plurality of fluid channels disposed on the base plate, wherein each of the plurality of fluid channels is inserted and secured between a pair of adjacent heat spreading structures, wherein each of the fluid channels comprises:
a channel inlet to receive at least a portion of the two-phase fluid from the inlet port,
a channel outlet to allow the received portion of the two-phase fluid to flow through and exit the corresponding fluid channel, and
one or more intermediate outlets disposed between the channel inlet and the channel outlet to allow at least a portion of the received two-phase fluid to exit the cooling plate either in a vapor form or a liquid form.

20. The cooling system of claim 19, further comprising a temperature sensor, wherein the pump is controlled by the temperature sensor to manage a flow of the two-phase fluid to the plurality of fluid channels.

* * * * *